(12) United States Patent
Agarwal

(10) Patent No.: US 9,013,039 B2
(45) Date of Patent: Apr. 21, 2015

(54) WAFER SUPPORT SYSTEM FOR 3D PACKAGING

(71) Applicant: GLOBALFOUNDRIES Inc., Grand Cayman (KY)

(72) Inventor: Rahul Agarwal, Waterford, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/959,252

(22) Filed: Aug. 5, 2013

(65) Prior Publication Data
US 2015/0035140 A1 Feb. 5, 2015

(51) Int. Cl.
| H01L 21/30 | (2006.01) |
| H01L 21/46 | (2006.01) |
| H01L 21/78 | (2006.01) |
| H01L 23/00 | (2006.01) |
| H01L 21/768 | (2006.01) |

(52) U.S. Cl.
CPC .......... *H01L 24/10* (2013.01); *H01L 21/76885* (2013.01)

(58) Field of Classification Search
CPC ........ H01L 21/304; H01L 24/13; H01L 24/11
USPC ................... 438/692, 459; 257/737, 773, 778
See application file for complete search history.

(56) References Cited

U.S. PATENT DOCUMENTS

| 2002/0048907 | A1* | 4/2002 | Miyamoto et al. | 438/464 |
| 2006/0003550 | A1 | 1/2006 | Periasamy et al. | |
| 2009/0212429 | A1* | 8/2009 | Do et al. | 257/738 |
| 2010/0155936 | A1* | 6/2010 | Codding et al. | 257/734 |
| 2011/0133338 | A1* | 6/2011 | Topacio et al. | 257/751 |
| 2011/0207294 | A1* | 8/2011 | Nakanishi et al. | 438/459 |
| 2014/0051233 | A1* | 2/2014 | Agarwal et al. | 438/462 |

OTHER PUBLICATIONS

ZoneBond, "Thin-Wafer-Handling Technology", retrieved Jan. 29, 2013, retrieved from the internet: <URL: www.brewerscience.com/products/temporary-bonding-materials/zonebond>, pp. 1-2.
ZoneBond® Low-Stress Thin Wafer Handling Process, Brewer Science, 2013, 2 pages, (www.brewerscience.com/producs/temporary-bonding-materials/zonebond.).

* cited by examiner

*Primary Examiner* — Kimberly Rizkallah
*Assistant Examiner* — Brian Turner
(74) *Attorney, Agent, or Firm* — Ditthavong & Steiner, P.C.

(57) ABSTRACT

A method for handling and supporting a device wafer during a wafer thinning process and the resulting device are provided. Embodiments include forming a plurality of solder bumps on a first surface of a substrate having a first and a second surface; removing a portion from a periphery of the first surface of the substrate; forming a temporary bonding material on a first carrier; bonding the first surface of the substrate with the temporary bonding material of the first carrier; affixing the second surface of the substrate to a second carrier; and removing the temporary bonding material.

18 Claims, 8 Drawing Sheets

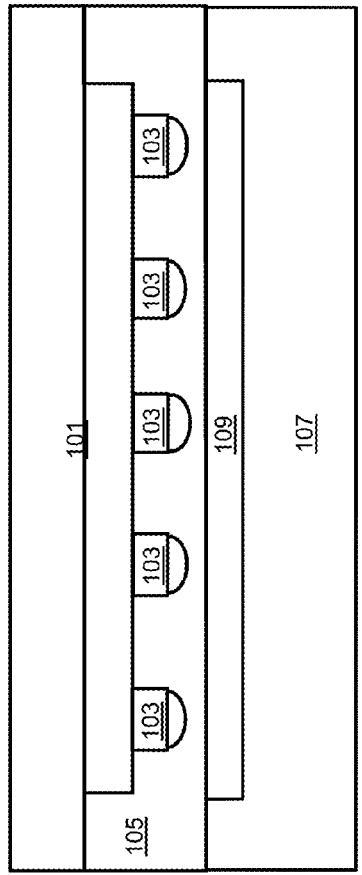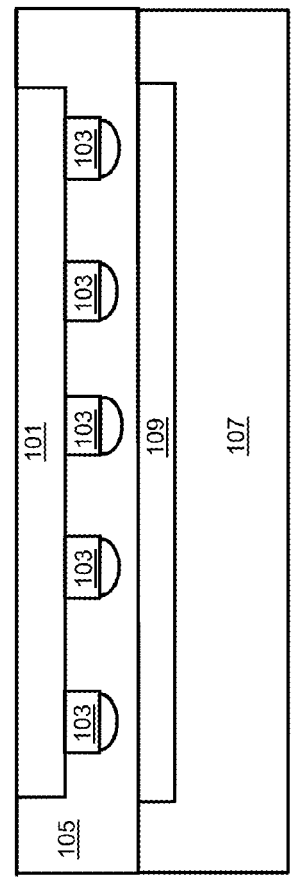
FIG. 1C
Background Art
FIG. 1D
Background Art

WAFER SUPPORT SYSTEM FOR 3D PACKAGING

TECHNICAL FIELD

The present disclosure relates to handling of a device wafer, e.g., a complementary metal-oxide-semiconductor (CMOS) wafer, and more particularly to a wafer support system for 3D packaging.

BACKGROUND

Handling and supporting device wafers during a wafer thinning process poses a challenge. A known approach for handling device wafers during the thinning process involves seven steps: 1) trimming; 2) coating; 3) bonding; 4) thinning; 5) treating; 6) affixing; and 7) debonding, as illustrated in FIGS. 1A through 1G, respectively. During the trimming step (FIG. 1A), a portion from a periphery of a first surface of a device wafer 101, having a plurality of solder bumps 103, is removed. The device wafer 101 is then coated with a bonding material 105, e.g. a glue material, and a carrier 107 is treated at 109 to allow bonding only around an outer edge, as shown in FIG. 1B. Next, the device wafer 101 is bonded to the carrier 107, as illustrated in FIG. 1C. Then, as illustrated in FIG. 1D, a second surface of the device wafer 101 is thinned. Once the desired thickness of the device wafer 101 is reached, a chemical edge treatment is performed on the bonding material 105, as illustrated at element 105' in FIG. 1E. Next, the second surface of the device wafer 101 is affixed to a film frame or other substrate 111 and the device wafer 101 is separated from the carrier 107, as shown in FIG. 1F. Thereafter, the bonding material 105 and 105' is removed from the device wafer 101 as illustrated in FIG. 1G. However the bonding material 105/105 may cause contamination of the wafer 101, and cleaning the bonding material 105/105' from the front side of the device wafer 101, for example after the wafer 101 is on the film frame 111, is required.

Another known approach (not shown for illustrative convenience) involves creating separate zones, e.g., stiction/nonstiction, to prevent bonding of a full wafer, e.g., a 300 millimeter (mm) wafer, to a carrier wafer. However, this approach causes additional processing complexities and also requires cleaning of the front side of the thin wafer after the wafer is transferred to the film frame.

A need therefore exists for methodology for handling and supporting a device wafer during wafer thinning without a need for special treatment of the carrier and extra cleaning of the device wafer and without bonding material causing the front side of the wafer to become contaminated, and the resulting device.

SUMMARY

An aspect of the present disclosure is a method of handling and supporting a device wafer during a wafer thinning process.

Another aspect of the present disclosure is a device including a bumped device wafer attached to a film frame.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including: forming a plurality of solder bumps on a first surface of a substrate having a first and a second surface; removing a portion from a periphery of the first surface of the substrate; forming a temporary bonding material on a first carrier; bonding the first surface of the substrate with the temporary bonding material of the first carrier; affixing the second surface of the substrate to a second carrier; and removing the temporary bonding material.

Aspects of the present disclosure include forming the plurality of solder bumps by: forming a bump metallization pad on the first surface of the substrate; forming a photoresist template with a plurality of openings on top of the bump metallization pad; and forming a solder bump on the bump metallization pad at each of the openings of the photoresist template. Further aspects include removing the periphery of the first surface of the substrate by: mechanical dicing. Another aspect includes, removing 50 µm to 500 µm of depth and 0.5 mm to 10 mm of width of the periphery of the first surface of the substrate. Other aspects include forming the temporary bonding material only on a circumference of the first carrier. Additional aspects include forming the temporary bonding material from a thermoplastic or a temporary glue material. Further aspects include the first carrier being flat, and forming the temporary bonding material to a thickness of 100 µm to 600 µm. Another aspect includes the first carrier being recessed, and forming the temporary bonding material to a thickness of 5 µm to 50 µm. Other aspects include bonding the first surface of the substrate to the temporary bonding material of the first carrier only at the circumference. Additional aspects include removing a portion of the second surface of the substrate prior to affixing the second surface of the substrate to the second carrier. Further aspects include removing the portion of the second surface of the substrate by: mechanical grinding. Another aspect includes removing exposed temporary bonding material. Other aspects include affixing the second surface of the substrate to the second carrier with dicing tap. Additional aspects include removing the photoresist template and exposed bump metallization by: laser ablation, chemical etch and/or thermal process.

Another aspect of the present disclosure is a device including: a substrate having a first surface and a second surface; a bump metallization pad on the first surface of the substrate; a plurality of solder bumps on the bump metallization pad; and a tape frame attached to the second surface of the substrate. Aspects of the device include the tape frame being attached to the second surface of the substrate with dicing tape.

Another aspect of the present disclosure is a method including: removing a portion from periphery of first surface of a substrate by mechanical dicing; forming a plurality of bump metallization pads on the first surface of the substrate; forming a solder bump on each of the bump metallization pads; forming a temporary bonding material only on a circumference of a carrier; bonding the first surface of the substrate with the temporary bonding material only at the circumstance of the first carrier; thinning a second surface of the substrate by mechanical grinding; affixing the thinned second surface of the substrate to a tape frame; removing the temporary bonding material; and removing the photoresist template and exposed bump metallization material.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1G schematically illustrate sequential steps of a background method of handling and supporting a device wafer during wafer thinning.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of device wafer contamination and the need for special treatment of the carrier and extra cleaning of the device wafer attendant upon handling device wafers during thinning processes. Moreover, the present disclosure also addresses and solves the alternative problem of having to create separate zones to prevent bonding of full wafers to a wafer carrier.

Methodology in accordance with embodiments of the present disclosure includes forming a plurality of solder bumps on a first surface of a substrate having a first and a second surface. A portion from a periphery of the first surface of the substrate is removed along the periphery. A temporary bonding material is formed on a first carrier. The first surface of the substrate is bonded with the temporary bonding material of the first carrier. The second surface of the substrate is affixed to a second carrier. The temporary bonding material is removed from the substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
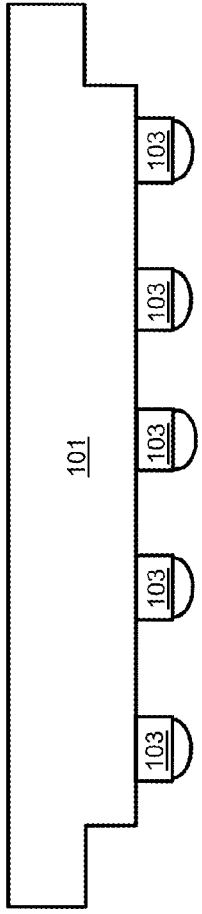
Figure 1B:
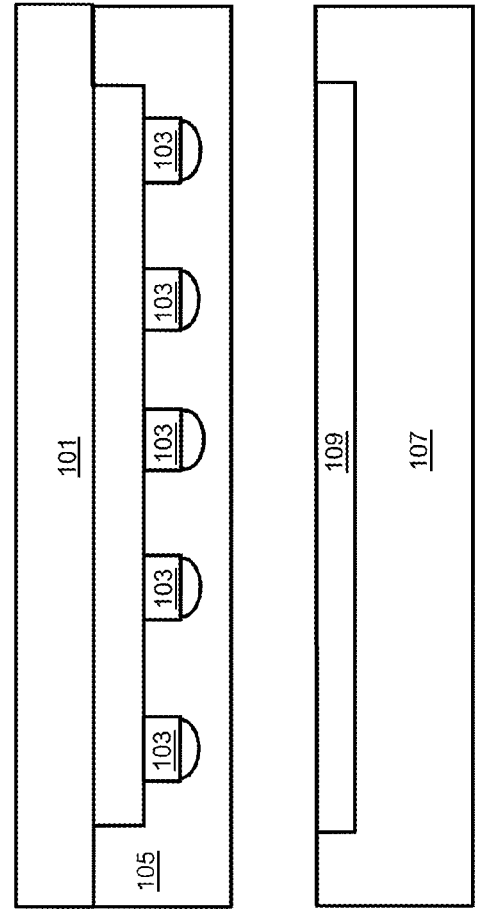
Figure 1E:
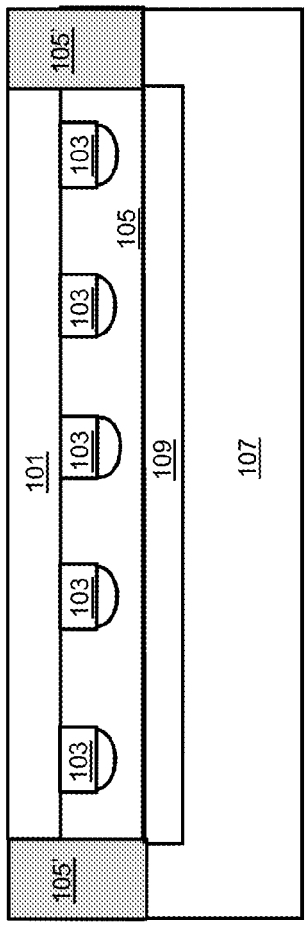
Figure 1F:
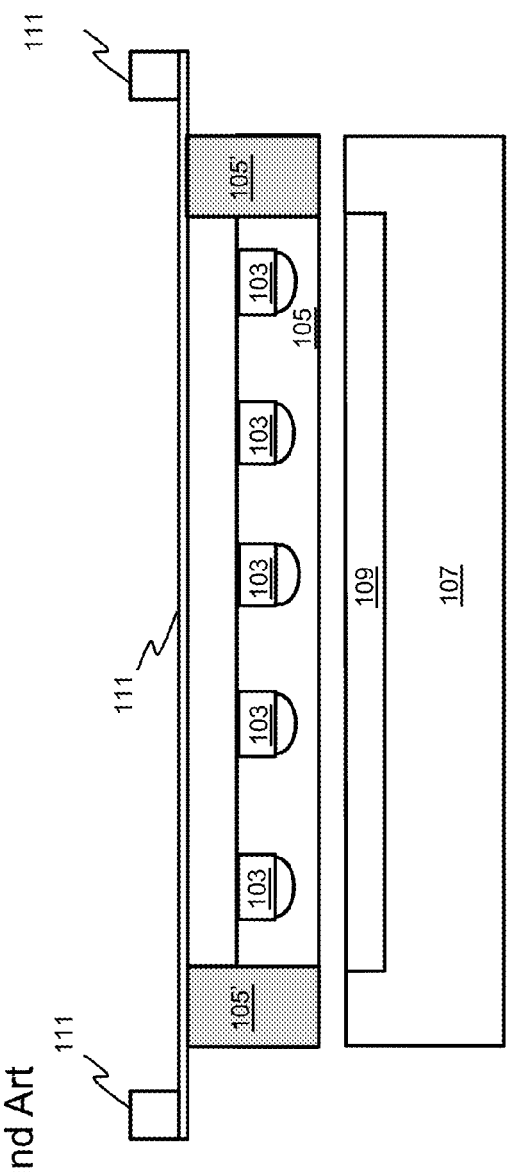
Figure 1G:
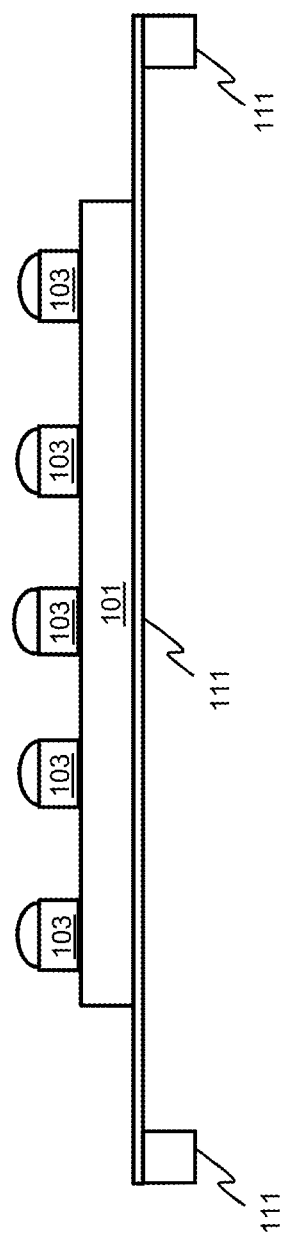
Figure 2A:
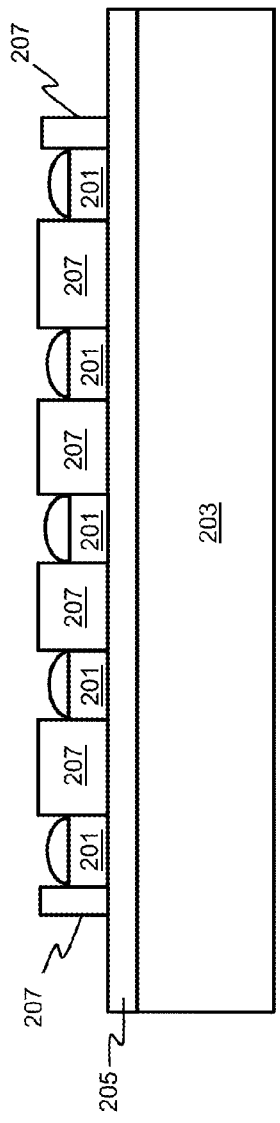
FIGS. 2A through 2G schematically illustrate sequential steps of a method of handling and supporting a device wafer during a wafer thinning process, in accordance with an exemplary embodiment of the present disclosure.

Adverting to FIG. 2A, a plurality of solder bumps 201, e.g., of lead-tin, tin-silver (SnAg), or copper (Cu) pillars, are formed on a first surface of a substrate 203, for example by electronic chemical deposition (ECD). More specifically, a bump metallization pad 205, e.g., of titanium tungsten/copper (TiW/C), is formed on the first surface of the substrate 203. Thereafter, a photoresist template 207 with a plurality of openings is formed on the bump metallization pad 205. Next, a solder bump 201 is formed on the bump metallization pad 205 at each of the openings of the photoresist template 207.

Figure 2B:
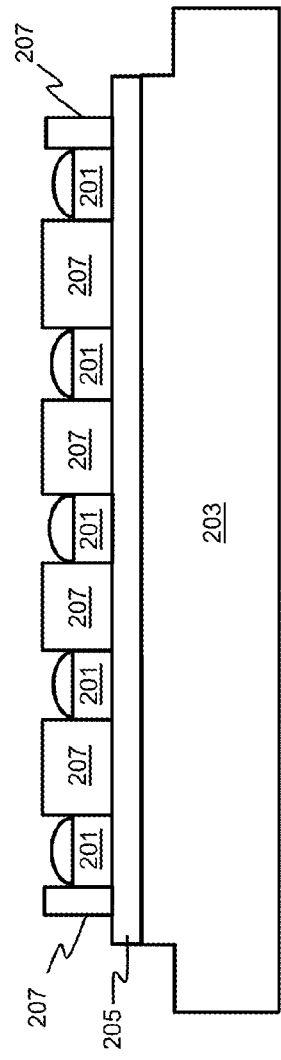

Once the plurality of solder bumps 201 are formed on bump metallization pad 205, 50 µm to 500 µm of depth and 0.5 mm to 10 mm of width of the periphery of the first surface of the substrate 203 and the bump metallization pad 205 are removed by mechanical dicing, as illustrated in FIG. 2B. Alternatively, the periphery of the first surface of substrate 203 may be removed prior to forming the plurality of solder bumps 201.

Figure 2C:
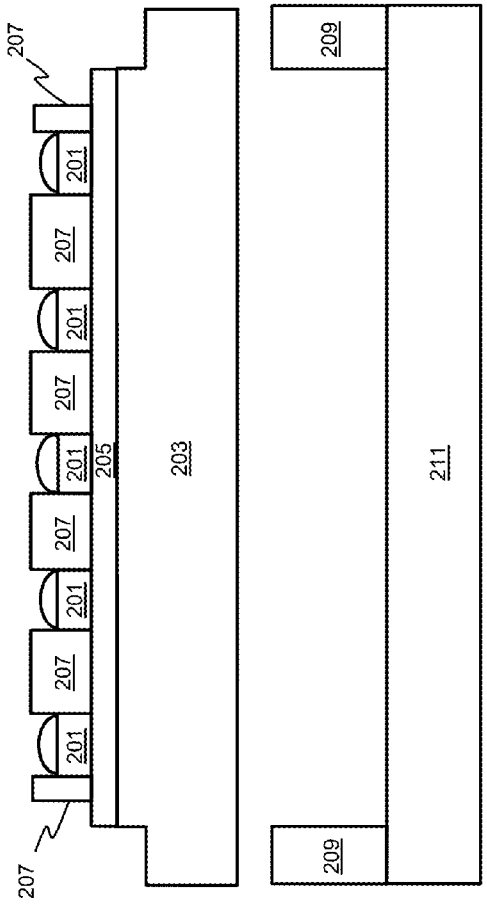

Next, a temporary bonding material 209, e.g., of a thermoplastic material or a temporary glue material, is formed on a circumference of a first carrier 211 as shown in FIG. 2C. For a flat carrier 211, the temporary bonding material 209 is formed to a thickness of 100 µm to 600 µm. Alternatively, if the carrier 211 is recessed, the temporary bonding material 209 is formed to a thickness of 5 µm to 50 µm. In particular, a thinner amount of temporary bonding material 209 may produce better total thickness variation (TTV) control across the substrate 203.

Figure 2D:
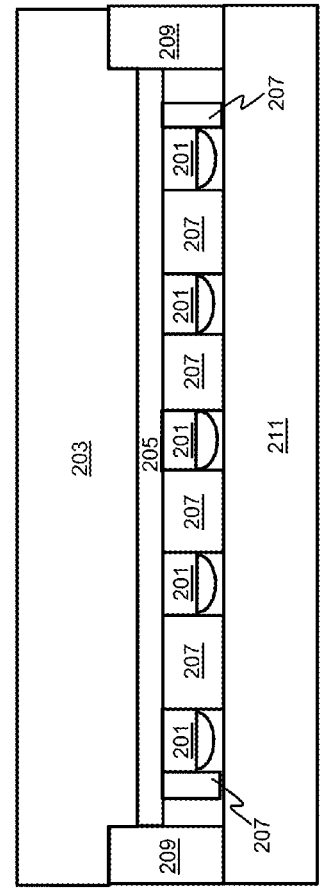
Figure 2E:
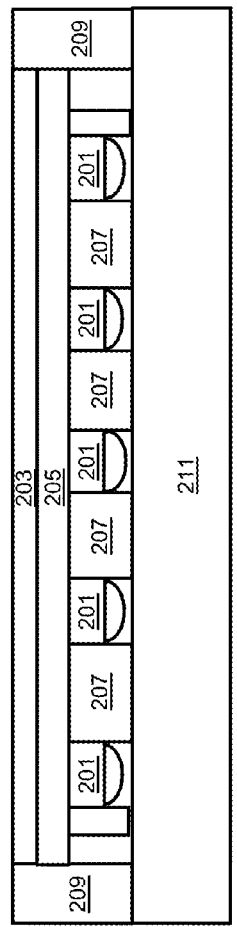
Figure 2F:
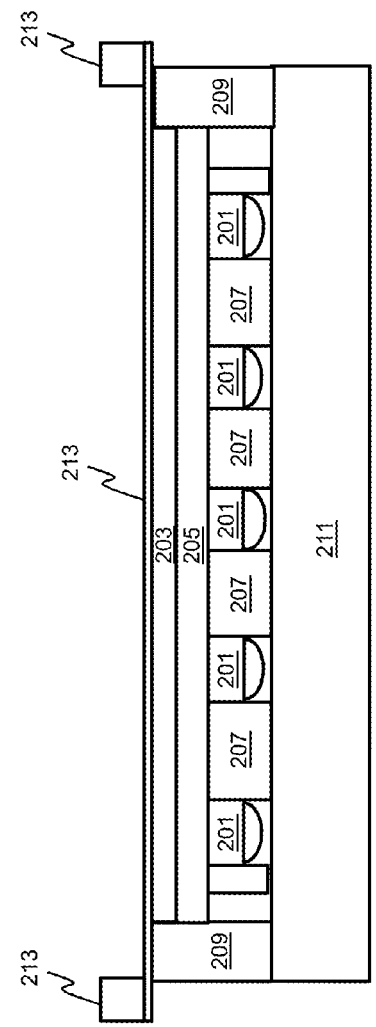

Adverting to FIG. 2D, the periphery of the first surface of the substrate 203 is bonded with the temporary bonding material 209 of the carrier 211. In particular, the photoresist template 207 is intended to protect the plurality of solder bumps 201 from coming into contact with the carrier 211. Next, a portion of the second surface of the substrate 203 is removed by mechanical grinding as illustrated in FIG. 2E, thinning the substrate 203. Thereafter, the second surface of the substrate 203 is affixed to a second carrier 213, e.g., a film frame, using dicing tape (not shown for illustrative convenience) as shown in FIG. 2F.

Figure 2G:
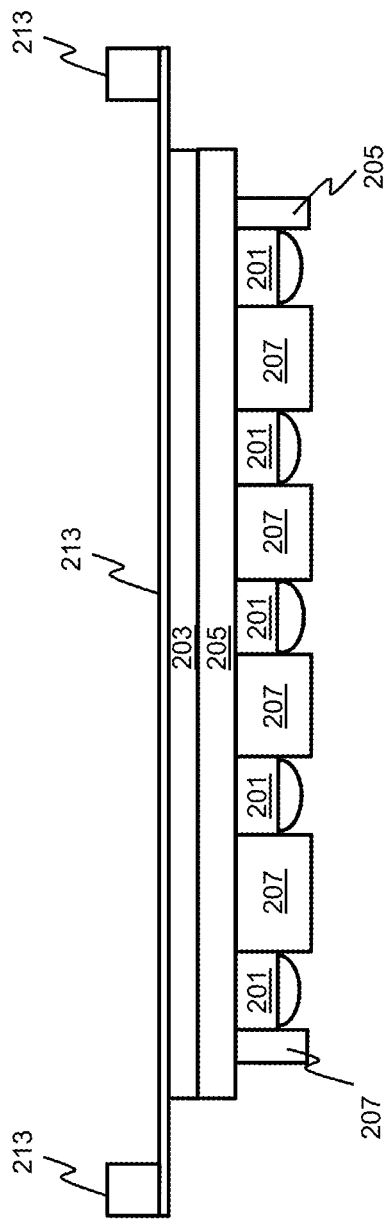

Subsequent to affixing the substrate 203 to the second carrier 213, an edge treatment is applied to dissolve the temporary bonding material 209. For example, the temporary bonding material 209 is removed from the first surface of the substrate 203 with room temperature, a UV release, a laser release, a chemical release, or a thermal release as illustrated in FIG. 2G. Last, the photoresist template 205 and exposed bump metallization pad 205 is removed by laser ablation, chemical etch, and/or thermal processing. Then, conventional processing, such as dicing, stacking, wafer reconstruction, e.g. for 3D packaging, may proceed.

The embodiments of the present disclosure can achieve several technical effects, including not requiring special treatment and extra cleaning to be performed on the device wafer, the front of the device wafer remains contamination free, and the disclosed process is less expensive compared to the known approaches. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of 3D wafer packaging applications, for example, packaging wafers after fabricating TSV 3D interconnects.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a plurality of solder bumps on a first surface of a substrate having a first and a second surface;
    removing a portion from only a periphery of the first surface of the substrate;
    forming a temporary bonding material on a periphery of a first carrier;
    bonding the first surface of the substrate with the temporary bonding material of the first carrier only along the periphery of the first surface of the substrate at the location of the removed portion of the substrate;
    affixing the second surface of the substrate to a second carrier; and
    removing the temporary bonding material.

2. The method according to claim 1, comprising forming the plurality of solder bumps by:
    forming a bump metallization pad on the first surface of the substrate;
    forming a photoresist template with a plurality of openings on the bump metallization pad; and
    forming a solder bump on the bump metallization pad at each of the openings of the photoresist template.

3. The method according to claim 2, comprising removing the photoresist template and exposed bump metallization material by:
    laser ablation, chemical etch, and/or thermal processing.

4. The method according to claim 2, wherein the photoresist template has a height greater than a height of the solder bumps, so as to protect the plurality of solder bumps from coming into contact with the first carrier.

5. The method according to claim 1, comprising removing the portion from the periphery of the first surface of the substrate by: mechanical dicing.

6. The method according to claim 5, comprising removing 50 micrometers ($\mu$m) to 500 $\mu$m of depth and 0.5 mm to 10 mm of width of the periphery of the first surface of the substrate.

7. The method according to claim 1, wherein the temporary bonding material comprises a thermoplastic or a temporary glue material.

8. The method according to claim 1, wherein the first carrier is flat.

9. The method according to claim 8, comprising forming the temporary bonding material to a thickness of 100 $\mu$m to 600 $\mu$m.

10. The method according to claim 1, wherein the first carrier is recessed.

11. The method according to claim 10, comprising forming the temporary bonding material to a thickness of 5 $\mu$m to 50 $\mu$m.

12. The method according to claim 1, wherein the first surface of the substrate is bonded to the temporary bonding material of the first carrier only at the circumference.

13. The method according to claim 1, comprising removing a portion of the second surface of the substrate prior to affixing the second surface of the substrate to the second carrier.

14. The method according to claim 13, comprising removing the portion of the second surface of the substrate by: mechanical grinding.

15. The method according to claim 1, comprising removing exposed temporary bonding material.

16. The method according to claim 1, comprising affixing the second surface of the substrate to the second carrier with dicing tape.

17. The method according to claim 1, comprising removing the temporary bonding material from the first surface of the substrate with room temperature, an ultraviolet (UV) release, a laser release, a chemical release, or a thermal release.

18. A method comprising:
    removing a portion from only a periphery of a first surface of a substrate by mechanical dicing;
    forming a bump metallization pad on the first surface of the substrate;
    forming a photoresist template with a plurality of openings on the bump metallization pad;
    forming a solder bump on the bump metallization pad at each of the openings;
    forming a temporary bonding material on a circumference of a carrier;
    bonding the periphery of the first surface of the substrate with the temporary bonding material on the first carrier only at the circumference at the location of the removed portion of the substrate;
    thinning a second surface of the substrate by mechanical grinding;
    affixing the thinned second surface of the substrate to a tape frame;
    removing the temporary bonding material; and
    removing the photoresist template and exposed bump metallization material.

* * * * *